United States Patent
Chan et al.

(10) Patent No.: US 7,054,184 B2
(45) Date of Patent: May 30, 2006

(54) CACHE LATE SELECT CIRCUIT

(75) Inventors: Yuen H. Chan, Poughkeepsie, NY (US); Timothy J. Charest, West Hurley, NY (US); Antonio R. Pelella, Highland Falls, NY (US); John R. Rawlins, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 10/844,296

(22) Filed: May 12, 2004

(65) Prior Publication Data

US 2005/0254285 A1    Nov. 17, 2005

(51) Int. Cl.
*G11C 11/00* (2006.01)
*G11C 7/00* (2006.01)

(52) U.S. Cl. .................. 365/154; 365/156; 365/189.08
(58) Field of Classification Search .................. 365/49, 365/189.02, 189.05, 230.02, 230.08, 154, 365/156, 189.08, 205, 207, 208
See application file for complete search history.

(56) References Cited

U.S. PATENT DOCUMENTS

| | | | |
|---|---|---|---|
| 4,905,188 A | | 2/1990 | Chuang et al. |
| 5,418,922 A | | 5/1995 | Liu et al. |
| 5,499,204 A | * | 3/1996 | Barrera et al. ................. 365/49 |
| 5,535,351 A | * | 7/1996 | Peng ........................... 365/49 |
| 5,588,130 A | * | 12/1996 | Fujishima et al. ............ 365/49 |
| 5,680,363 A | * | 10/1997 | Dosaka et al. ................ 365/49 |
| 5,699,317 A | * | 12/1997 | Sartore et al. ................ 365/49 |
| 5,778,428 A | | 7/1998 | Batson et al. |
| 5,802,594 A | | 9/1998 | Wong et al. |
| 6,076,140 A | | 6/2000 | Dhong et al. |
| 6,317,351 B1 | * | 11/2001 | Choi et al. .................... 365/49 |
| 6,356,990 B1 | | 3/2002 | Aoki et al. |
| 2003/0061446 A1 | | 3/2003 | Lee et al. |

* cited by examiner

*Primary Examiner*—Trong Phan
(74) *Attorney, Agent, or Firm*—Lynn L. Augspurger; Laurence J. Marhoefer

(57) ABSTRACT

A late select circuit topology has pseudo-static circuits that provide fast dynamic circuit operation without the use of dynamic clock timing signals. An output from a selected set is enabled by the conjunction of bit line pulse and set select signal.

4 Claims, 4 Drawing Sheets

US 7,054,184 B2

CACHE LATE SELECT CIRCUIT

RELATED APPLICATIONS

This application is related to the following patent applications filled of even date herewith, assigned to the assignee of this application, and incorporated by reference herein: Output Driver With Pulse to Static Converter, Ser. No. 10/844,298, filed on May 12, 2004; Programmable Sense Amplifier Timing Generator, Ser. No. 10/844,301, filed May 12, 2004; High Performance Programmable Array Local Clock Generator, Ser. No. 10/843,991, filed on May 12, 2004 and issued as U.S. Pat. No. 6,850,460 on Feb. 1, 2005.

FIELD OF THE INVENTION

This invention relates to improved circuitry for enabling the output of a selected set in an SRAM set-associative memory array, and more particularly to pseudo-static circuit that provides fast dynamic operation without the use of dynamic timing clocks.

BACKGROUND

A set-associative cache memory has two critical timing paths; the cache array access path and the directory/TLB look up path (i.e. the hit logic path). For a read operation, in order to speed up the cache access, the hit logic operation and the cache array read operation are usually overlapped in time. That is, both operations are performed in parallel during the same clock cycle. Depending on the cache array size or the directory/TLB configuration, either one of them can be limiting the system cycle time. The selected set identification signals from the hit logic path usually come late, at the end of the cache access cycle. These select signals enable an output from one of the sets that make up the set associative cache, for example one of four sets or one of eight sets. The late select function and its circuit implementation are a very important part in the overall cache performance. In prior art designs, the late select implementation is generally complex in terms of circuit implementation and the use of clock signals for timing.

SUMMARY OF THE INVENTION

An object of this invention is the provision of a late select circuit topology that improves the performance of the set associative CMOS SRAM while at the same time reducing the circuit and timing complexity. Briefly, this invention contemplates the provision of a late select circuit topology in which pseudo-static circuits are employed to provide fast dynamic circuit operation without the use of dynamic clock timing signals. An output from a selected set is enabled by the conjunction of bit line pulse and set select signal.

DETAILED DESCRIPTION OF THE INVENTION

Figure 1:
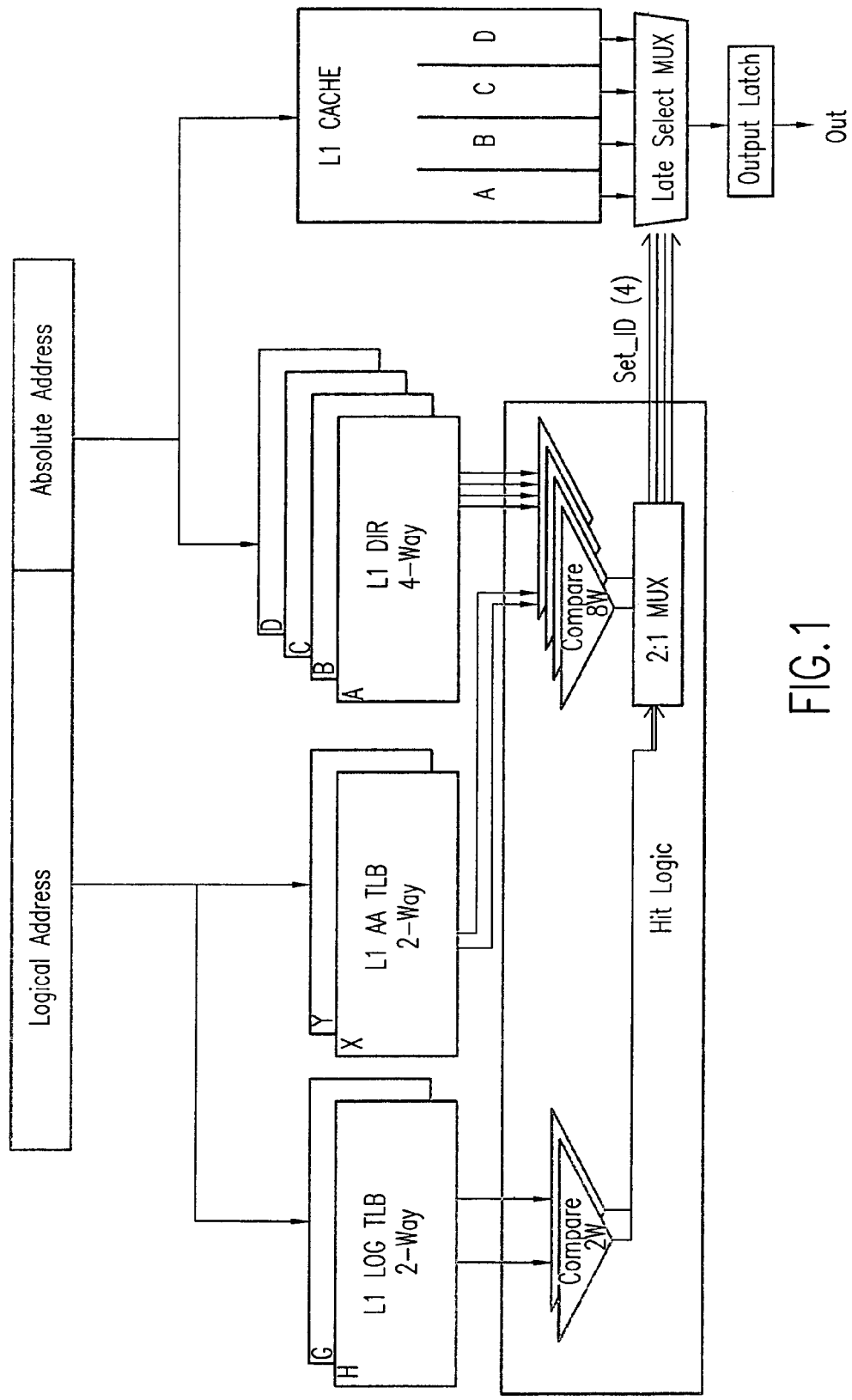
FIG. 1 is a Simplified Logical Diagram of typical set-associative cache memory system.

FIG. 1 is a high level functional Simplified Logical Diagram of a Set-Associative Cache System, of the type to which this invention pertains. The system has two time critical paths. The TLB/DIR lookup hit logic path comprised of L1 LOG TLB, L1 AA TLB and L1 DIR is one of these and the cache array read path is the other. Cache Logical Address addresses the L1 LOG TLB and L1 AA TLB and Cache Absolute Address addresses L1 DIR. The cache array shown here is a four way set associative cache array, with the sets A, B, C, and D. The four late select outputs set_IDA, B, C, or D are generated in the Hit Logic block which includes comparators Compare 2W and Compare 8W, and 2:1 MUX. The late select multiplex circuit (Late Select MUX), in addition to other functions, enables the output (out) addressed from the selected set in the array which is latched in the Output Latch.

Figure 2:
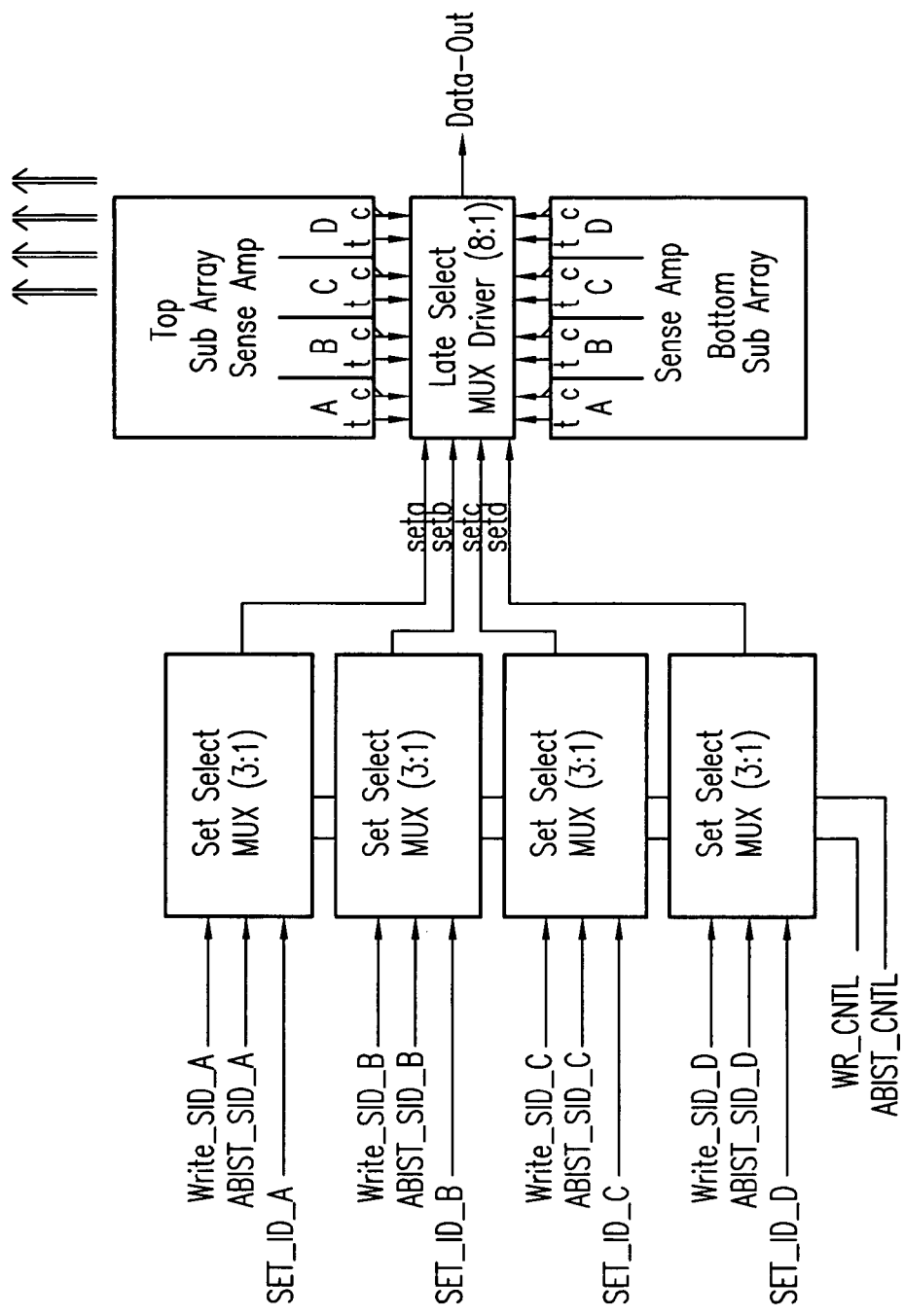
FIG. 2 is a block diagram of a late select scheme in accordance with the teachings of this invention.

Referring now to FIG. 2, the late select function in accordance with this invention has a front end set select multiplexer (Set Select MUX Driver (3:1)) that provides a three way multiplex function among the read SET-ID A,B,C, or D, the Write_SID_A,B,C, or D, (to support a write through function) and the ABIST_SID_A,B,C, or D (to support the ABIST test mode operation). The back end eight to one output multiplexer (Late Select MUX Driver (8:1)) selects one of the four data set, and in this embodiment of the invention, between top and bottom sub-arrays (Top Subarray Sense Amp and Bottom Subarray Sense Amp).

Figure 3:
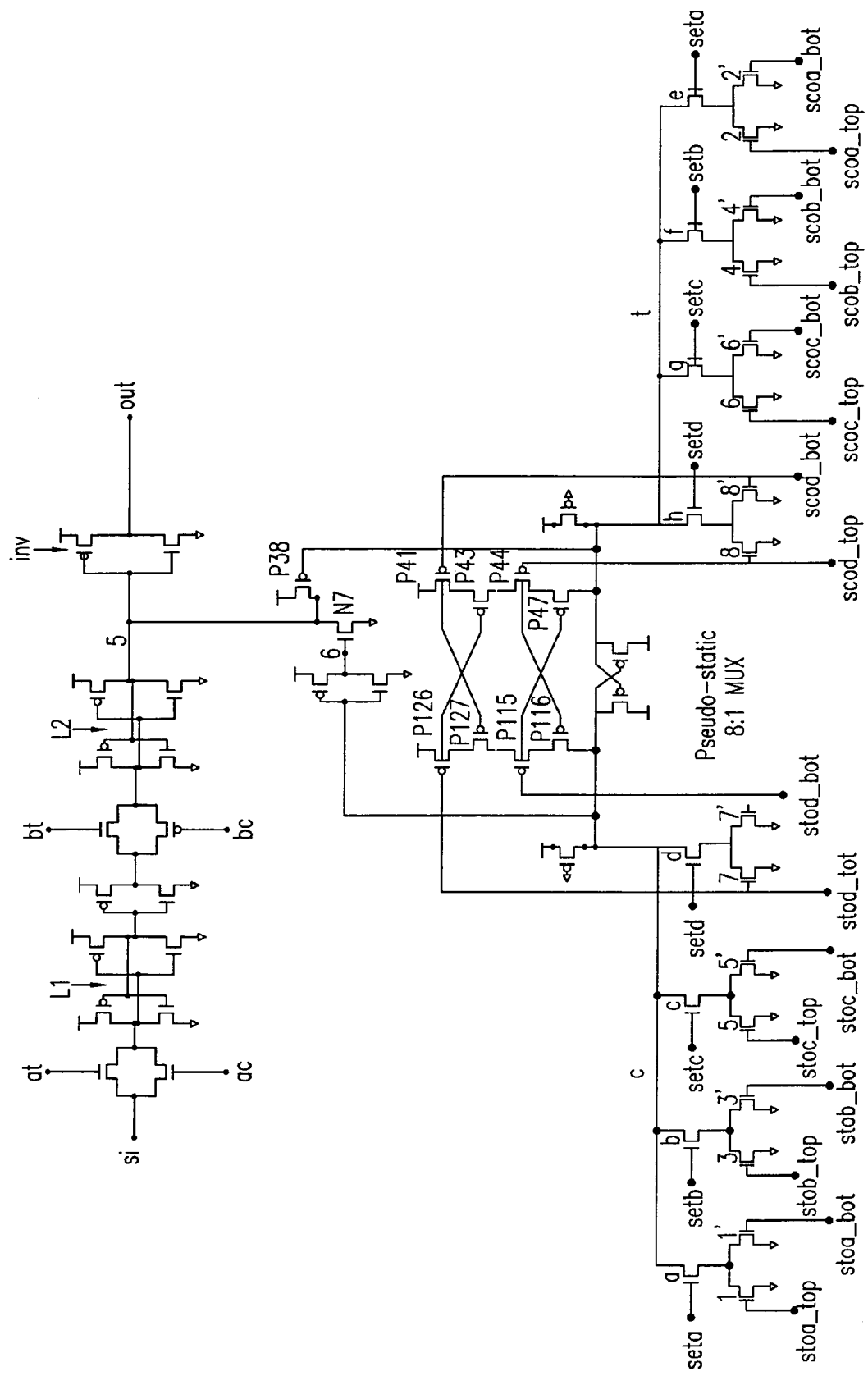
FIG. 3 is a schematic drawing pseudo-static late select multiplexer in accordance with the teachings of this invention.
Figure 4:
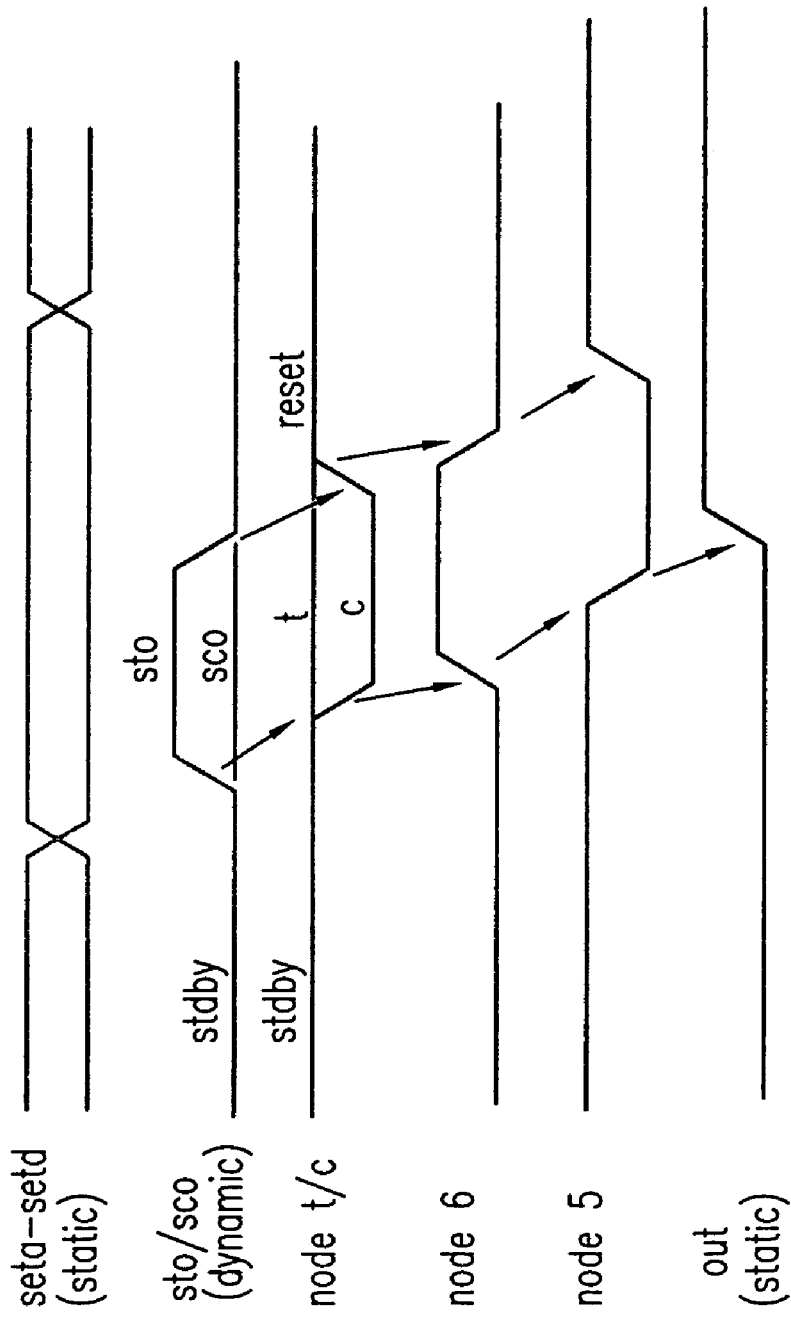
FIG. 4 is a timing diagram of a late select multiplexer circuit showing events in the operation of FIG. 3 in sequence.

Referring now to FIGS. 3 and 4, late select multiplexer is a pseudo-static circuit. It has a static-like circuit topology. The circuit, however, operates in dynamic mode with dynamic inputs signals instead of static. This design totally eliminates the need of an explicit reset clock, which is characteristic of typical dynamic circuits. Because of its unique pseudo-static topology and the elimination of explicit reset circuitry, its circuit complexity (hence device count) is greatly reduced. Its switching power and delay are much improved over prior art designs. Referring to FIG. 3, the new late select multiplexer consists of 3 circuit functions:

The 8:1 MUX has four static or pseudo static (i.e., pulses) inputs labeled seta, setb, setc, and setd coupled to the gates of NFETs a–e, b–f, c–g, and d–h, respectively. These are set ID inputs coming from the front end set select mux circuit as shown in FIG. 2. These 4 set ID inputs are orthogonal, one and only one (or none) of them is active at a time. They drive into the left (node c) and the right (node t) sides of the multiplex evaluation stacks. The lower stack of the 8:1 MUX are true (t) and complement (c) inputs coming from the sense amplifiers of the top and bottom halves sub arrays of FIG. 2. (For illustration purpose, 4-way set associative array is shown in FIG. 2. It should be understood that other associativities such as 2-way, 6-way, or 8-way etc. are also possible). The true outputs of the top sense amplifiers are labeled stoa_top, stob_top, stoc_top, and stod_top and are coupled to the gates of NFETS 1, 3, 5, and 7, respectively. Their complement outputs are labeled scoa_top, scob_top, scoc_top, and scod_top and are coupled to the gates of NFETs 2, 4, 6, and 8, respectively. Likewise, the bottom sense amplifier true outputs are labeled stoa_bot, stob_bot, stoc_bot, stod_bot are coupled to the gates of NFETs 1', 3', 5', and 7', respectively, and the complement outputs are scoa_bot, scob_bot, scoc_bot, scod_bot are coupled to he gates of NFETs 2', 4', 6', and 8', respectively. The true outputs (sto) are connected to the left side of the 4-way evaluation stack of FIG. 3, whereas the complement outputs (sco) are connected to the right side. These sense amplifier true and complement outputs are dynamic signals (pulses) with active high ("1") and reset low ("0") logic states. During a read or write array operation, either the top or bottom sub array is selected, hence its corresponding sense amplifiers are turned on to provide dynamic output signals. The unselected sub array and its sense amplifiers are off, hence having "0" outputs. Inputs from the active sense amplifiers, in conjunction (i.e., "AND") with the active set ID inputs, will pull down either the "t" or "c" circuit node of FIG. 3, sending corresponding data into the L2 latch as well as the driver output. Since the active sense amplifiers generate dynamic output, the output pulses are usually well controlled and synchronized by the sense amplifier timing generator (not shown here). The leading edge (rising from standby low to high level) of the sense amplifier pulse will trigger the 8:1 mux switching. The trailing edge (falling from active high to standby low) of the sense amplifier signals stod_top, stod_bot and scod_top, scod_bot are used to restore the dynamic nodes "t" and "c" to their standby state (at high level) through the unique double cross-coupled 4-high PFET stacks.

This cross-coupled PFET restore structure consists of PFET devices P126, P127, P115 and P116 driving the "c" node, and PFET devices P41, P43, P44, and P47 driving the "t" node. Inputs to these cross-coupled PFETs are stod_top, stod_bot (sense amplifier "true" output of set-d from both the top and bottom subarray) and scod_top, scod_bot (sense amplifier "complement" output of set-d from the top and bottom subarray). Only the set-d signals from top and bottom subarrays are sampled here to drive the restore pfets, the other sets (set-A to set-C) are not used. This is done to reduce the restore structure's circuit topology. When a subarray is activated, all four sets will be active, hence only sampling one set (in this case, set-D) is sufficient. In the standby state, all the sense amplifier signals to the PFET restore devices are off (i.e., at low level). The cross-coupled 4-pfet stacks are both turned-ON, hence pulling up node "c" and node "t" to standby high level. In the active mode, either the stod or scod (from either the top or bottom subarray) will be turned on to an active high level. The 4-stack PFETs therefore are turned-OFF (thru the cross-coupled connections), allowing node "c" or "t" to be pulled down by the evaluation NFET stacks coupled to nodes t and c. At the end of an active read, the sense amplifier signals will all return to the standby low level. The 4-stack PFET restore devices hence will be turned on to restore node "c" or "t" to the high standby state.

With this circuit topology and way of operation, the circuit is restored without the need of an explicit restore clock. In an array standby state, all the sense amplifiers are off and their outputs are all low. The 8:1 MUX are inactive. Data is latched up in the L2 latch. A timing diagram showing the sequence of circuit switching activity is shown in FIG. 4. The top most line seta-setd in the drawing represents the orthogonal set select signals, only one of which is active "high" at a given time. The next line represents the sense amplifier signals sto(a–d) top/bottom and sco(a–d) top and bottom. As shown, sto sense amplifier for a selected set assumes its high active state, pulling down node c shown on the next line labeled node t/c. Node 6 rises and node 5 falls as shown in the next two lines labeled Nod 6 and Nod 5. The output of the multiplexer is shown in the last line (out) as rising due to the output inverter.

Since the 8:1 MUX operates in dynamic mode, its signals needed to be converted to static before driving out. The dynamic-to-static conversion is done by FET devices labeled p38 and n7. PFET p38 pulls down node 5 when node c is in an active state and NFET n7 pulls up node 5 when note t is in an active state. These two devices also provide amplification to drive the L2 latch as well as the driver output inverter stage labeled inv. The output signal is fully static (not pulsed) so that it could interface with normal static logic down stream.

As described in more detail in the co-pending application entitled Output Driver With Pulse to Static Converter, the L1/L2 latches serves two purposes. One is to hold the output data when the dynamic 8:1 MUX is inactive. Second is to provide a master-slave (i.e., L1/L2) scan latch function for system initialization as well as to support test mode operation. The scan input is labeled si. Its data is passed to the L1 latch comprised of the cross-coupled inverter pair labeled L1 thru the PFET/NFET pass-gate coupled to the scan A-clock inputs, when the scan A-clock (labeled at and ac) is active. The L1 data is moved to the L2 latch comprised of the cross-coupled inverter pair labeled L2 thru the second PFET/NFET pass-gate when the scan B-clock (labeled bt and bc) coupled to the PFET/NFET pass-gate is active. In normal mode operation, both the A and B scan clocks are off. The L2 latch is controlled by the dynamic-to-static converter, as described in the co-pending application Output Driver With Pulse To Static Converter. In scan mode, the array is inactive, the 8:1 MUX as well as the dynamic-to-static converter are off. The L2 latch is controlled by the scan B-clock.

While the preferred embodiment of the invention has been described, it will be understood that those skilled in the art, both now and in the future, may make various improvements and enhancements which fall within the scope of the claims which follow. These claims should be construed to maintain the proper protection of the invention described herein.

The invention claimed is:

1. A set associative SRAM cache memory circuit for generating an output signal indicating the state of an addressed memory cell in a memory cell set selected from a plurality of memory cell sets (FIGS. 1 and 3) comprising in combination:

a multiplexer with a set input (seta, setb, setc, setd) from each of said plurality of memory cell sets and a sense input (stoa, b, c, d or scoa, b, c, d) from a sense amplifier in each of said plurality of memory cell sets;

said set input from each of said memory cell sets having a select state and said sense input from said sense amplifier in each of said memory sets having an active state and a standby state (seta-setd; sto/sco FIG. 4);

a plurality of logic circuits, one for each of said memory cell sets, each of said logic circuits having one set input and one sense input (transistors with sto/sco inputs and transistors with set inputs FIG. 3) and each having its output coupled to a common node precharged high (c or t FIG. 3; node t/c FIG. 4);

each of said plurality of logic circuits responsive to said set input in said select state occurring in conjunction with said sense input in said active state to pull down said common node from its precharged high state (FIG. 4);

a circuit to restore said common node to said precharged high state in response to a sense input from said sense amplifier in each of said memory cell sets in its standby state (P126, P127, P115, P116, P41, P43, P44, P47 FIG. 3); and a circuit responsive to a state of said node for generating said output signal (N7-P38 FIG. 3).

2. A set associative SRAM as in claim 1, wherein circuit to restore said common node includes a stack of cross-coupled FET transistors coupled to a single sense amplifier input (stod-bot, stod-top, FIG. 3).

3. A set associative SRAM as in claim 1, further including a latch (L2, FIG. 3) to hold a state of said output signal.

4. A set associative SRAM as in claim 2, further including a latch (L2, FIG. 3) to hold a state of said output signal.

* * * * *